(12) United States Patent
Park et al.

(10) Patent No.: US 11,769,728 B2
(45) Date of Patent: Sep. 26, 2023

(54) BACKSIDE POWER DISTRIBUTION NETWORK SEMICONDUCTOR PACKAGE AND METHOD OF MANUFACTURING THE SAME

(71) Applicant: SAMSUNG ELECTRONICS CO., LTD., Suwon-si (KR)

(72) Inventors: Saehan Park, Clifton Park, NY (US); Hoonseok Seo, Niskayuna, NY (US); Jeonghyuk Yim, Halfmoon, NY (US); Ki-il Kim, Clifton Park, NY (US); Gil Hwan Son, Clifton Park, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 205 days.

(21) Appl. No.: 17/159,972

(22) Filed: Jan. 27, 2021

(65) Prior Publication Data
US 2022/0157723 A1    May 19, 2022

Related U.S. Application Data

(60) Provisional application No. 63/113,631, filed on Nov. 13, 2020.

(51) Int. Cl.
| | | |
|---|---|---|
| *H01L 23/528* | (2006.01) | |
| *H01L 21/768* | (2006.01) | |
| *H01L 21/822* | (2006.01) | |
| *H01L 23/48* | (2006.01) | |

(Continued)

(52) U.S. Cl.
CPC .... *H01L 23/5286* (2013.01); *H01L 21/76898* (2013.01); *H01L 21/8221* (2013.01); *H01L 23/481* (2013.01); *H01L 24/05* (2013.01); *H01L 27/0694* (2013.01); *H01L 2224/05025* (2013.01);

(Continued)

(58) Field of Classification Search
CPC ........... H01L 23/5286; H01L 21/76898; H01L 21/8221; H01L 23/481; H01L 24/05; H01L 27/0694; H01L 2224/05025; H01L 2224/05147; H01L 2224/05157; H01L 2224/05176; H01L 21/743; H01L 23/535;

(Continued)

(56) References Cited

U.S. PATENT DOCUMENTS

| | | | |
|---|---|---|---|
| 8,921,976 | B2 | 12/2014 | Zhang et al. |
| 9,035,474 | B2 | 5/2015 | Mazure et al. |
| 10,475,692 | B2 | 11/2019 | Licausi et al. |

(Continued)

FOREIGN PATENT DOCUMENTS

| | | | |
|---|---|---|---|
| EP | 3 324 436 A1 | 5/2018 | |
| EP | 3 671 859 A1 | 6/2020 | |

OTHER PUBLICATIONS

Communication dated Nov. 10, 2021, issued by the European Patent Office in counterpart European Application No. 21176650.6.

*Primary Examiner* — Jonathan Han
(74) *Attorney, Agent, or Firm* — Sughrue Mion, PLLC

(57) ABSTRACT

Provided is a semiconductor architecture including a carrier substrate, a landing pad included in the carrier substrate, a first semiconductor device provided on a first surface of the carrier substrate, the first semiconductor device including a first component provided on the landing pad, and a second semiconductor device provided on a second surface of the carrier substrate, a second component protruding from the second semiconductor device being provided on the landing pad.

9 Claims, 25 Drawing Sheets

(51) Int. Cl.
  *H01L 23/00* (2006.01)
  *H01L 27/06* (2006.01)
(52) U.S. Cl.
  CPC ............ *H01L 2224/05147* (2013.01); *H01L 2224/05157* (2013.01); *H01L 2224/05176* (2013.01)
(58) Field of Classification Search
  CPC .......... H01L 21/76838; H01L 23/5283; H01L 23/5386; H01L 27/0688
  See application file for complete search history.

(56) References Cited

U.S. PATENT DOCUMENTS

| | | |
|---|---|---|
| 10,586,765 B2 | 3/2020 | Smith et al. |
| 2016/0284731 A1 | 9/2016 | McMullan |
| 2018/0374791 A1* | 12/2018 | Smith ............... H01L 29/78696 |
| 2019/0080969 A1 | 3/2019 | Tsao |
| 2020/0105671 A1* | 4/2020 | Lai ........................ G06F 30/39 |
| 2020/0134128 A1* | 4/2020 | Peng ..................... H01L 23/535 |
| 2020/0135634 A1* | 4/2020 | Chiang ................. H01L 21/743 |
| 2020/0279811 A1 | 9/2020 | Hong et al. |
| 2020/0303551 A1 | 9/2020 | Chen et al. |

* cited by examiner

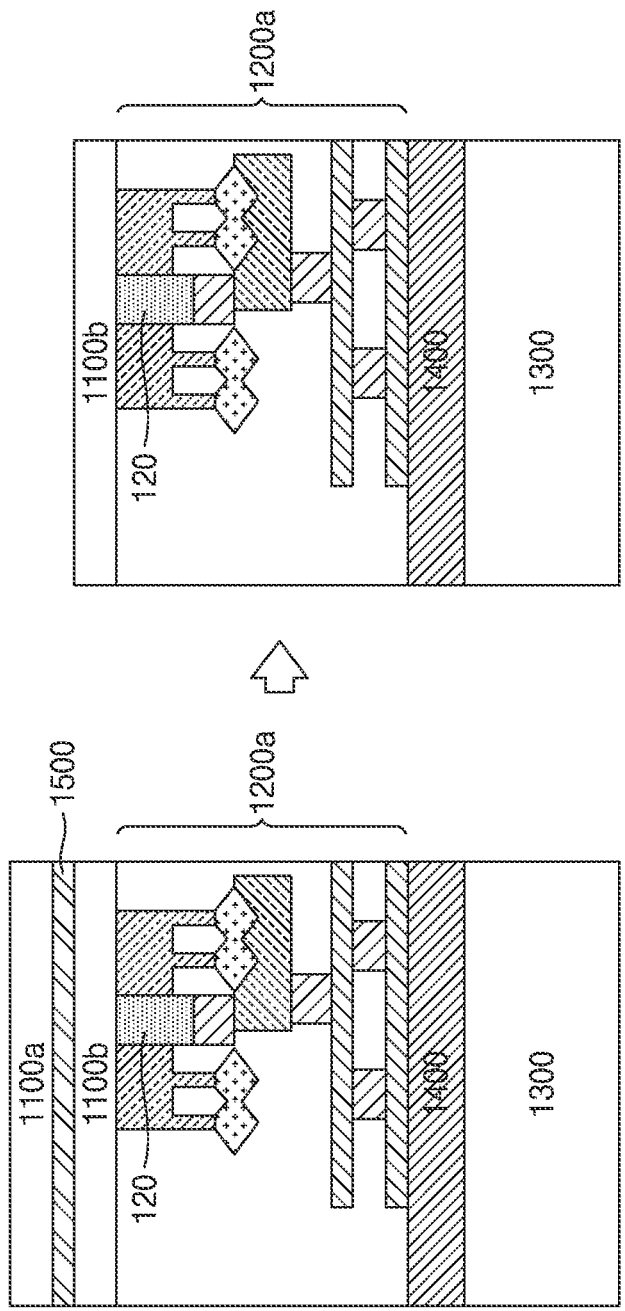

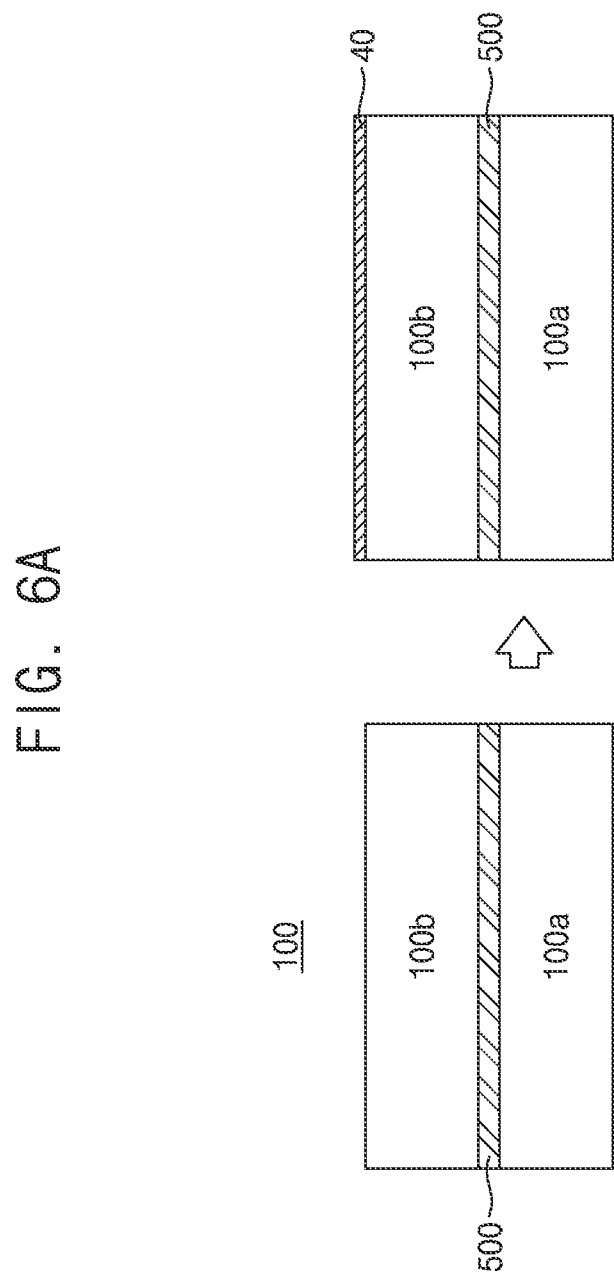

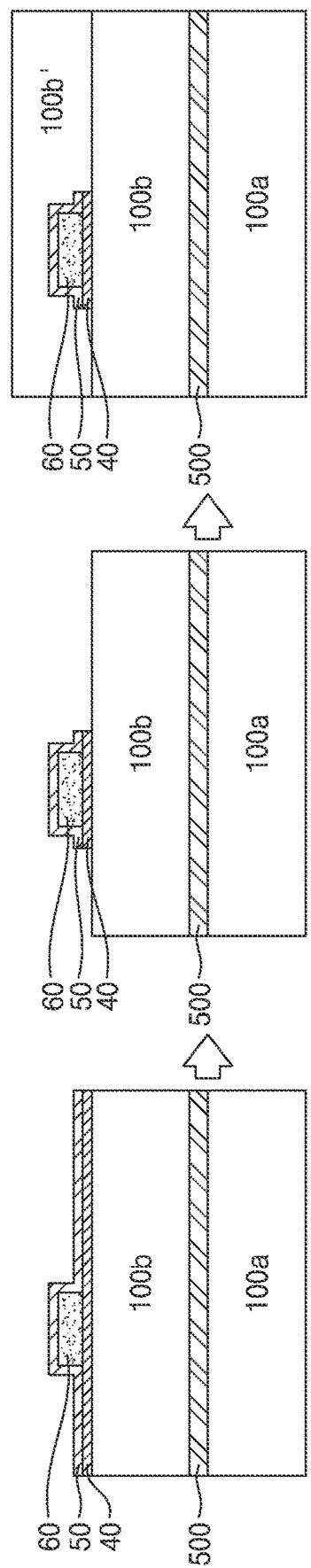

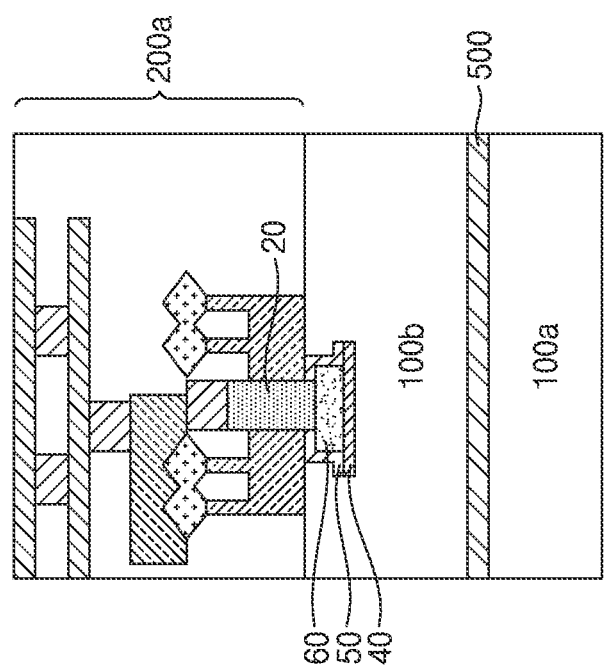

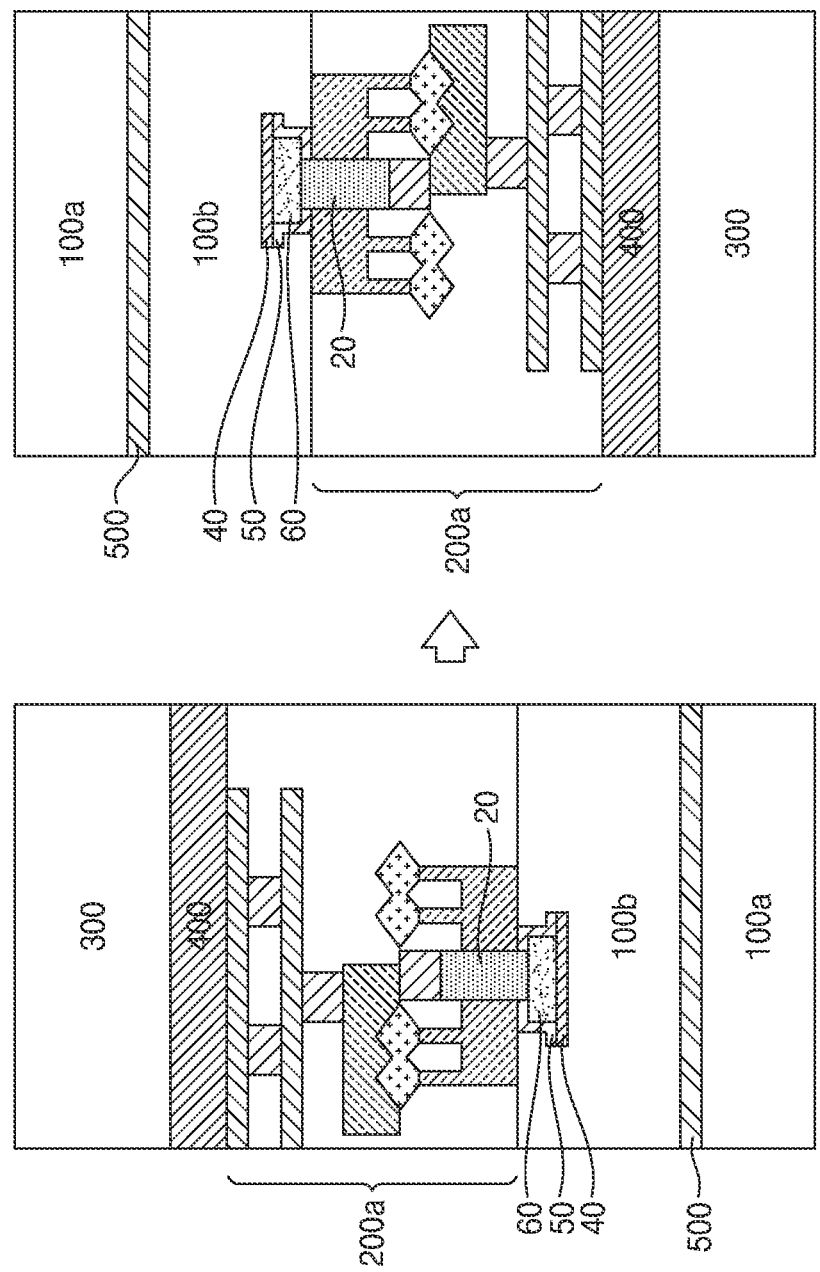

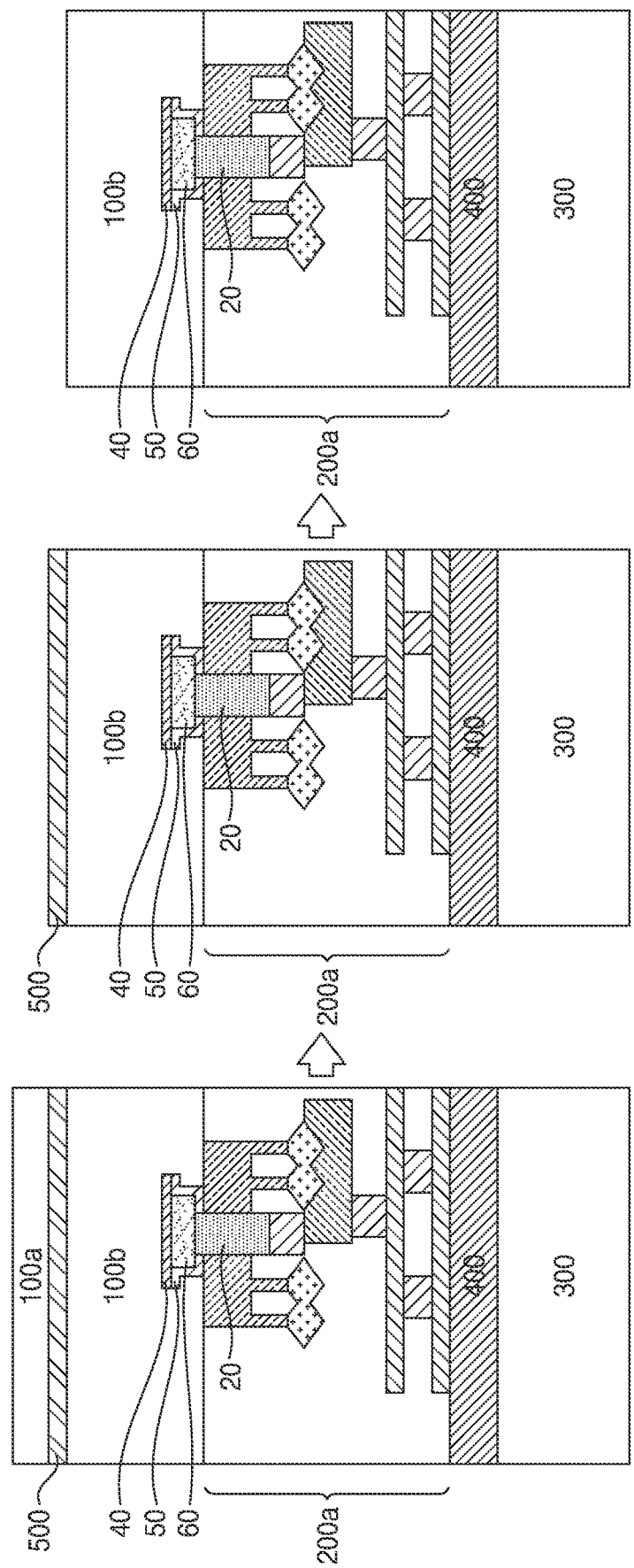

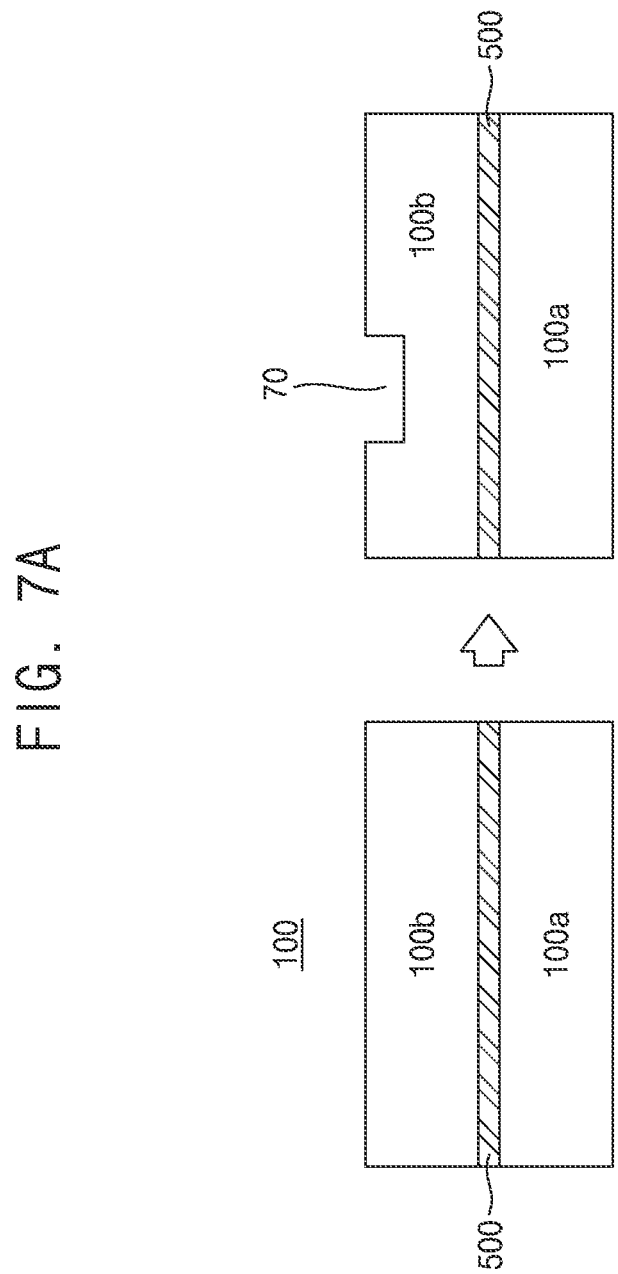

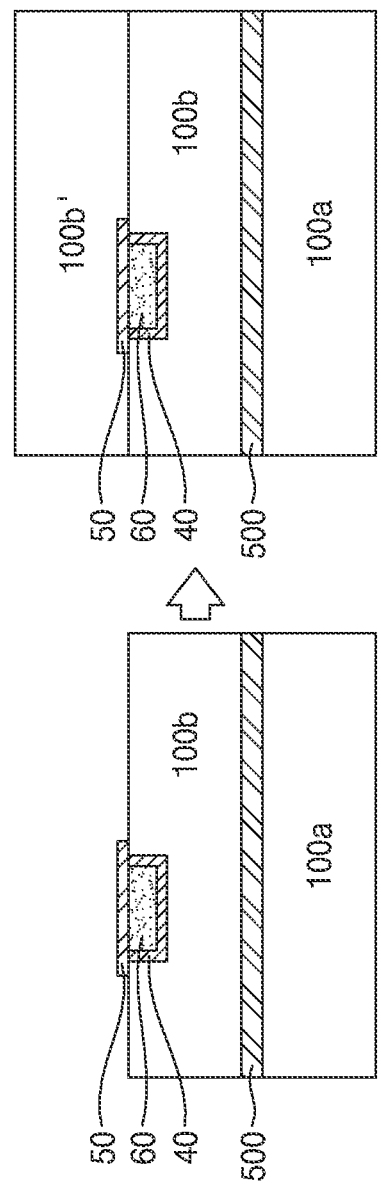

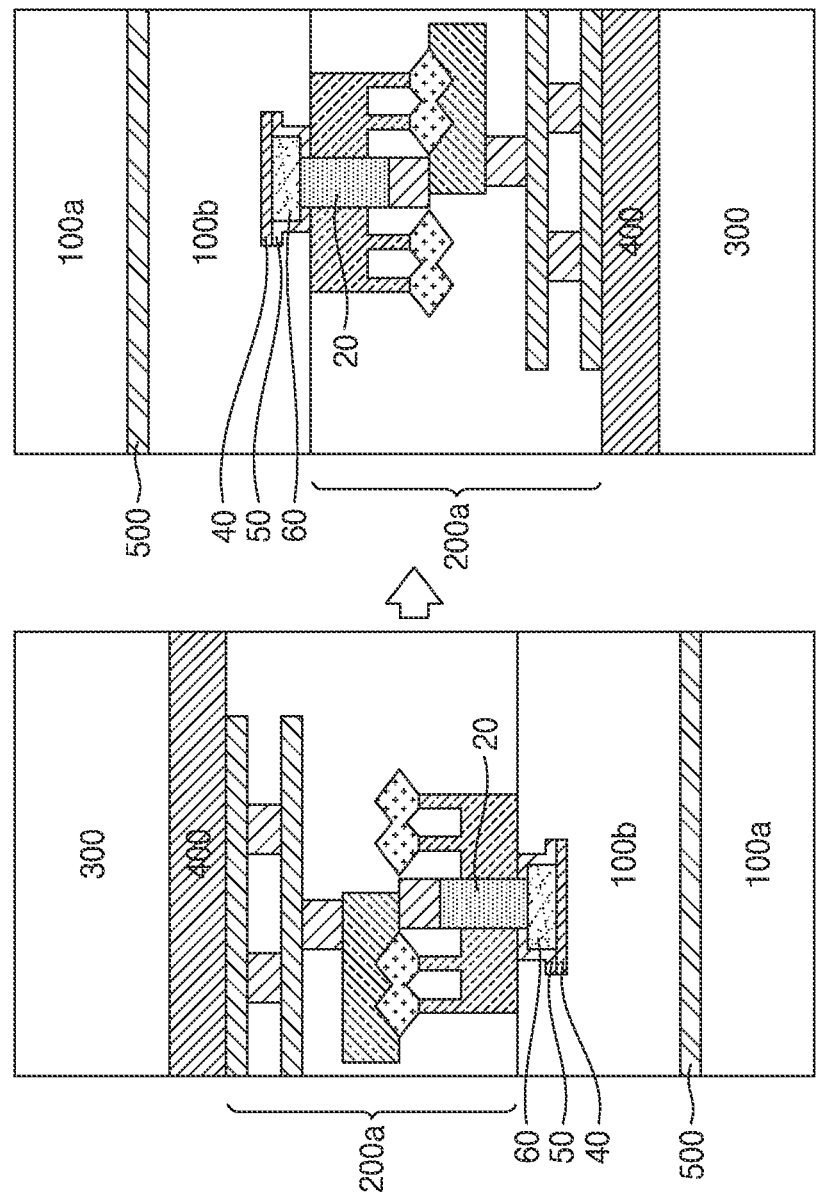

BACKSIDE POWER DISTRIBUTION NETWORK SEMICONDUCTOR PACKAGE AND METHOD OF MANUFACTURING THE SAME

CROSS-REFERENCE TO THE RELATED APPLICATION

This application is based on and claims benefit to U.S. Provisional Application No. 63/113,631 filed on Nov. 13, 2020 in the U.S. Patent and Trademark Office, the disclosure of which is incorporated herein in its entirety by reference.

BACKGROUND

1. Field

Example embodiments of the present disclosure relate to a backside power distribution network (BSPDN) semiconductor architecture and a method of manufacturing the same, and more particularly to a BSPDN semiconductor architecture including a landing pad and a method of manufacturing the same.

2. Description of Related Art

The BSPDN semiconductor architecture separates the signal wiring from the power distribution network (PDN) in a semiconductor device by providing an integrated circuit including active transistors, signal wires, and buried power rails (BPRs) on a first side of a wafer and providing the PDN on a second side of the wafer. The BSPDN semiconductor architecture may minimize the routing congestion and allow for down scaling of an area of the semiconductor architecture. A BSPDN semiconductor architecture may result in a ~30% reduction and an improved current-resistance (IR) drop as compared to a general PDN semiconductor architecture.

However, there may be difficulties in manufacturing BSPDN semiconductor architectures because accurately aligning an integrated circuit and a PDN provided on each side of a wafer may be difficult. For example, a misalignment between a buried power rail (BPR) included in the integrated circuit integrated on the first side of the wafer with a through-silicon via (TSV) protruding from the PDN integrated on the second side of the wafer may occur. Such misalignment between the BPR and the TSV may lead to an increase in resistance and device failure of the semiconductor architecture.

Technologies to improve alignment between the BPR and TSV by providing the TSV at a greater depth have been developed. For example, additional etching for the TSV may be carried out after the BPR is provided. However, increasing the depth of the TSV may damage the semiconductor architecture. Further, the additional etching would depend on a size of the BPR provided which would limit the manufacturing process of the additional etching, and the misalignment between the TSV and the BPR may still exist.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

One or more example embodiments provide a backside power distribution network (BSPDN) semiconductor architecture and a method of manufacturing the same.

One or more example embodiments also provide to a BSPDN semiconductor architecture including a landing pad and a method of manufacturing the same.

According to an aspect of an example embodiment, there is provided a semiconductor architecture including a carrier substrate, a landing pad included in the carrier substrate, a first semiconductor device provided on a first surface of the carrier substrate, the first semiconductor device including a first component provided on the landing pad, and a second semiconductor device provided on a second surface of the carrier substrate, a second component protruding from the second semiconductor device being provided on the landing pad.

According to another aspect of an example embodiment, there is provided a method of manufacturing a semiconductor architecture, the method including providing a wafer, forming a landing pad in the wafer, providing a first semiconductor device on a first surface of the wafer based on the landing pad such that a first component included in the first semiconductor device is provided on the landing pad, removing a portion of a second surface of the wafer, and providing a second semiconductor device on the second surface of the wafer based on the landing pad such that a second component protruding from the second semiconductor device is provided on the landing pad.

According to another aspect of an example embodiment, there is provided a semiconductor architecture including a wafer, a landing pad provided in the wafer, a signal routing semiconductor device provided on a first surface of the wafer, the first semiconductor device including a BPR provided on the landing pad, and a PDN semiconductor device provided on a second surface of the wafer, a TSV protruding from the second semiconductor device being provided on the landing pad.

BRIEF DESCRIPTION OF THE DRAWINGS

The above and/or other aspects, features, and advantages of example embodiments of the disclosure will be more apparent from the following description taken in conjunction with the accompanying drawings, in which:

FIGS. 3A, 3B, 3C, and 3D illustrate a method of manufacturing a BSPDN semiconductor architecture according to a related embodiment;

FIGS. 6A, 6B, 6C, 6D, 6E, and 6F illustrate a method of manufacturing a BSPDN semiconductor architecture according to an example embodiment;

FIGS. 7A, 7B, 7C, 7D, 7E, 7F, and 7G illustrate a method of manufacturing a BSPDN semiconductor architecture according to another example embodiment;

DETAILED DESCRIPTION

Figure 1:
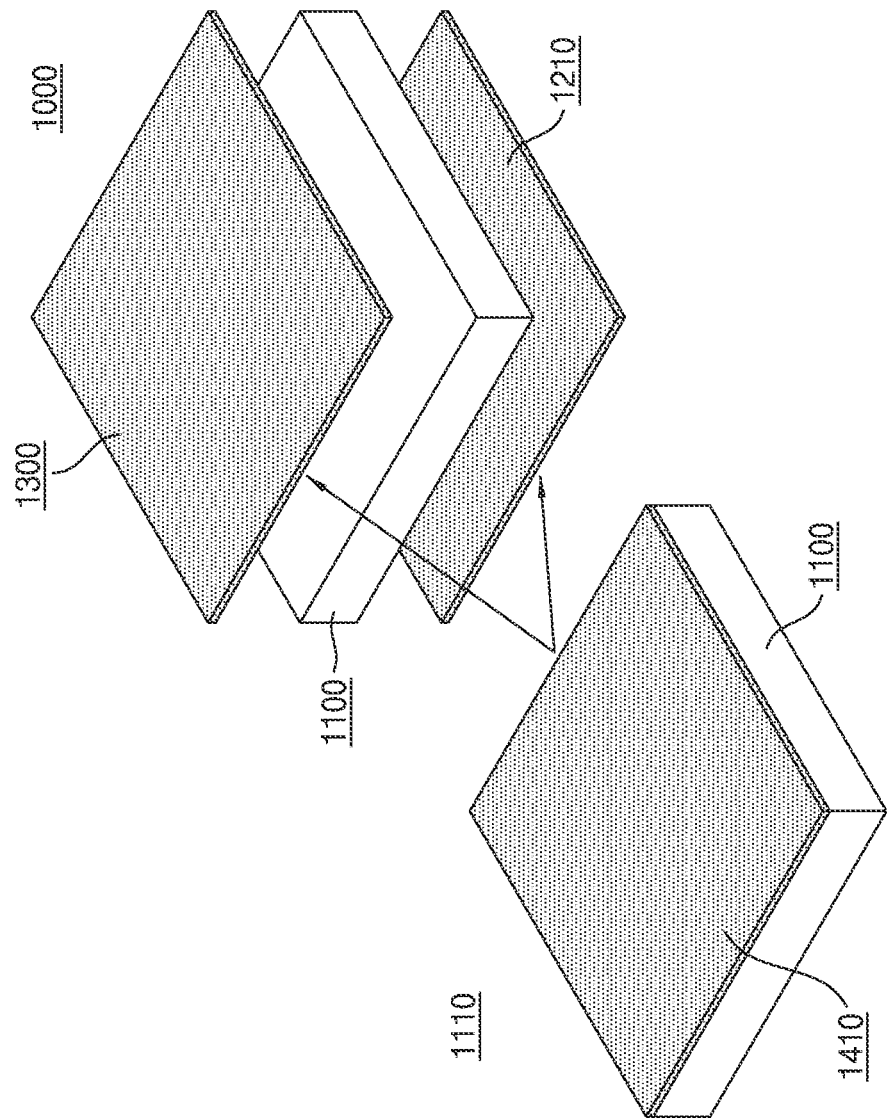
FIG. 1 illustrates a perspective view of a general PDN semiconductor architecture and a BSPDN semiconductor architecture according to an example embodiment.

The example embodiments described herein are examples, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or embodiment, unless otherwise mentioned in descriptions thereof.

In addition, it should be understood that all descriptions of principles, aspects, examples, and example embodiments are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "top," and "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation of manufacturing an apparatus or structure is described later than another step or operation, the step or operation may be performed later than the other step or operation unless the other step or operation is described as being performed after the step or operation.

Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure. Further, in the drawings, the sizes and relative sizes of layers and regions may be exaggerated for clarity.

For the sake of brevity, general elements to semiconductor devices may or may not be described in detail herein.

FIG. 1 illustrates a perspective view of a general PDN semiconductor architecture and a BSPDN semiconductor architecture according to an example embodiment.

Referring to FIG. 1, a general PDN semiconductor architecture 1110 includes a PDN/signal wiring device 1410 on one side of the wafer 1100. However, such configuration of the general PDN semiconductor architecture 1110 causes routing congestion in the PDN/signal wiring device 1410 and increases an area of the semiconductor architecture. In addition, a resistance of the general PDN semiconductor architecture 1110 may be relatively high.

As illustrated in FIG. 1, according to an example embodiment, a BSPDN semiconductor architecture 1000 is configured to separate the signal wiring semiconductor device 1210, to be provided a first side of the wafer 1100, from a power distribution network (PDN) semiconductor device 1300 to be provided on a second side of the wafer 1100 opposite to the signal wiring semiconductor device 1210.

The BSPDN semiconductor architecture 1000 according to an example embodiment may reduce the routing congestion and the area of the semiconductor architecture by removing the PDN from the first side of the wafer, and hence may also improve an IR drop. For example, the area of the semiconductor architecture may be reduced by 30% compared to the general PDN semiconductor architecture 1110. However, embodiments are not limited thereto.

Figure 2:
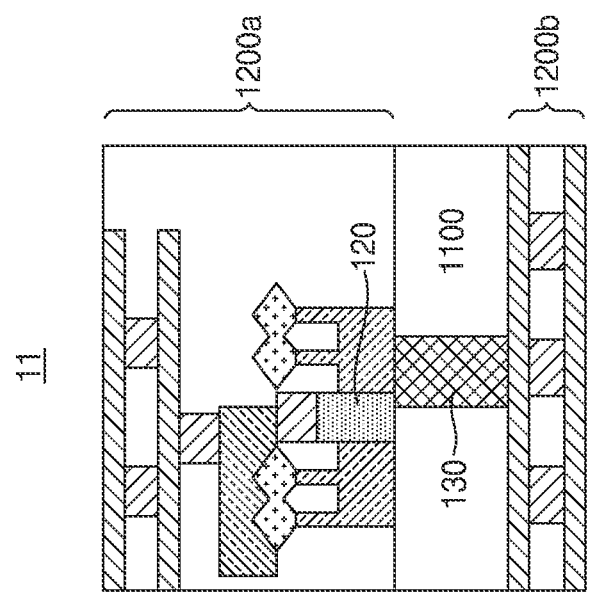
FIG. 2 illustrates a BSPDN semiconductor architecture according to a related embodiment.

FIG. 2 illustrates a BSPDN semiconductor architecture according to a related embodiment.

Referring the FIG. 2, the semiconductor architecture 11 may include a wafer 1100, a first semiconductor device 1200a provided on a first surface of the wafer 1100, and a second semiconductor device 1200b provided on a second surface of the wafer 1100. The first semiconductor device 1200a may be an integrated circuit for signal routing including components such as, for example, active transistors, signal wires, and BPRs 120, etc. The active transistors may include a power tapping epitaxial layer and a non-power tapping epitaxial layer. The signal wires are connected to the non-power tapping epitaxial layer of the active transistors for signal routing between the active transistors. The BPRs 120 are connected to the power tapping epitaxial layer of the active transistors and are not connected to the signal wires. The BPRs 120 are respectively configured to deliver power to the active transistors. The second semiconductor device 1200b may be a PDN integrated circuit. A TSV 130 configured as a power connecting structure may protrude from the semiconductor device 1200b.

As illustrated in FIG. 2, the BPR 120 included in the first semiconductor device 1200a and the TSV 130 protruding from the second semiconductor device 1200b may be misaligned with each other. The misalignment between the BPR 120 and the TSV 130 may increase the resistance of the semiconductor architecture 11 and may lead to a device failure of the semiconductor architecture 11.

FIGS. 3A through 3D illustrate a method of manufacturing a BSPDN semiconductor architecture according to a related embodiment.

Figure 3A:
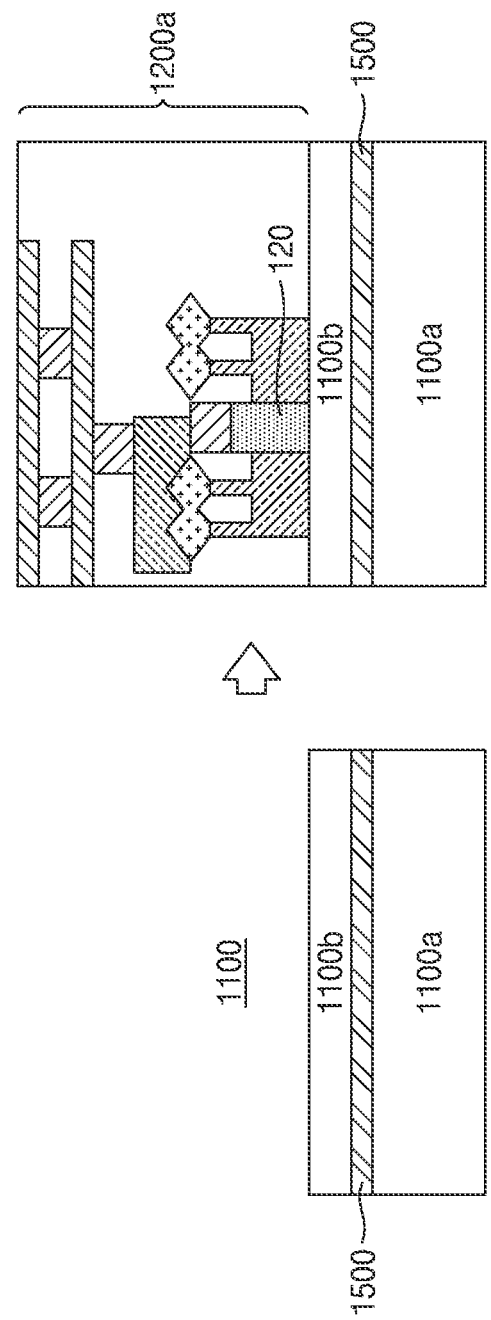

As illustrated in FIG. 3A, the method may include providing a wafer 1100 including a sacrificial layer 1100a, an etch stop layer 1500, and a carrier substrate 1100b. The sacrificial layer 1100a may be a silicon (Si) bulk layer, and the carrier substrate 1100b may be a Si layer. The etch stop layer 1500 may be provided between the sacrificial layer 1100a and the carrier substrate 1100b.

A first semiconductor device 1200a may be provided on a first surface of the carrier substrate 1100b. The first semiconductor device 1200a may be an integrated circuit including components such as, for example, active transistors, signal wires, and BPRs 120. The BPR 120 may be provided on a first surface of the carrier substrate 1100b.

Figure 3B:
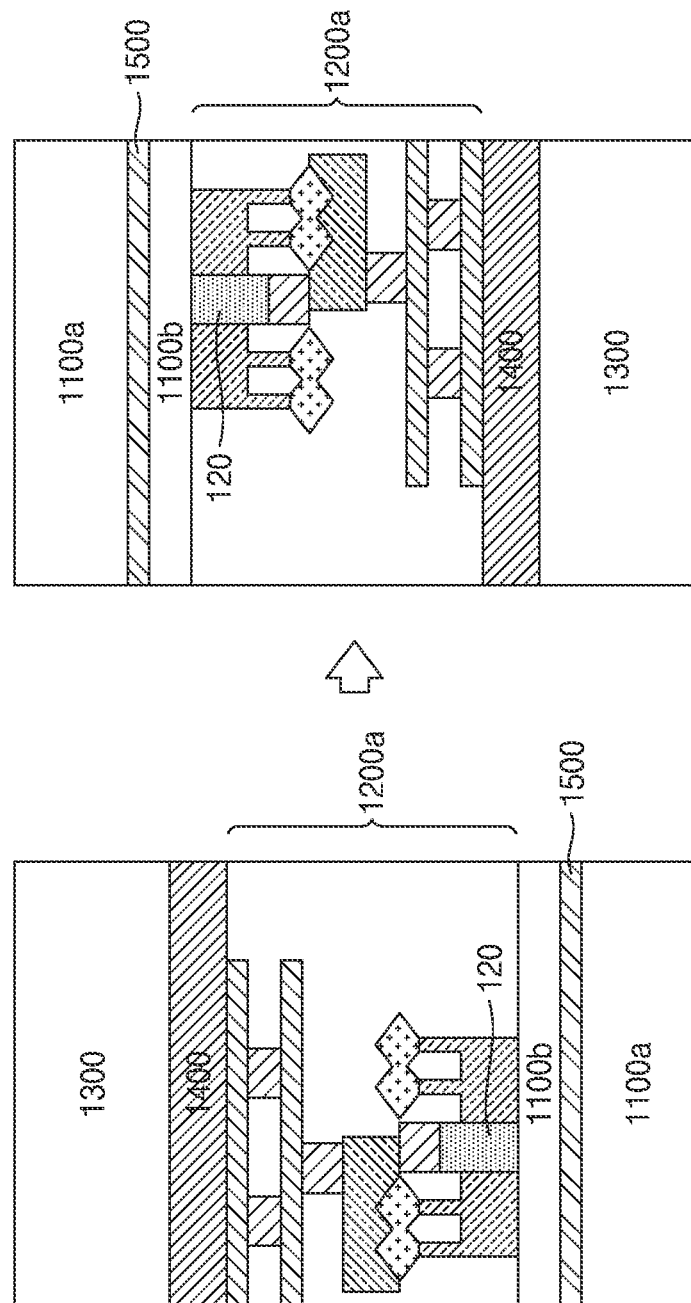

Referring to FIG. 3B, a wafer-to-wafer bonding process may be carried out. For example, a second wafer 1300 may be provided on a first surface of the first semiconductor device 1200a. The second wafer 1300 may be bonded by an adhesive layer 1400 provided between the first semiconductor device 1200a and the second wafer 1300. The wafer-to-wafer bonded semiconductor architecture is flipped.

Referring to FIG. 3C, the sacrificial layer 1100a may be removed, and the etch stop layer 1500 may be removed to expose the second surface of the carrier substrate 1100b.

Figure 3D:
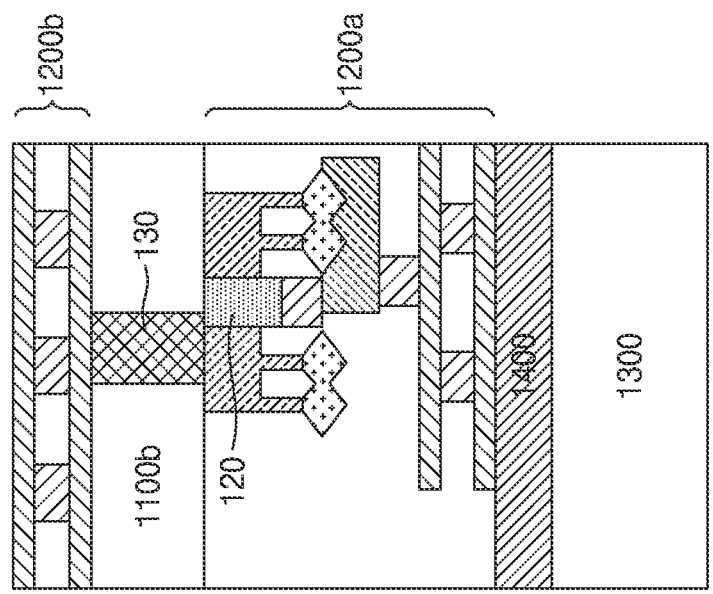

Referring to FIG. 3D, a second semiconductor device 1200b may be provided on the exposed second surface of the carrier substrate 1100b. The second semiconductor device 1200b may be a PDN integrated circuit with, for example, a TSV 130 protruding from a first surface of the second semiconductor device 1200b. The TSV 130 may be formed to penetrate the carrier substrate 1100b. The second semiconductor device 1200b may be provided on the second surface of the carrier substrate 1100b based on a location of the BPR 120 included in the first semiconductor device 1200a to land on the BPR 120.

However, as illustrated in FIG. 3D, a misalignment may occur between the TSV 130 and the BPR 120 because it is difficult to accurately detect a location of the BPR 120 during a TSV 130 landing process when integrating the second semiconductor device 1200b on a second side of the carrier substrate 1100b. Due to the misalignment between the TSV 130 and the BPR 120 which results in a misalignment between the first semiconductor device 1200a and the second semiconductor device 1200b, a resistance of the semiconductor architecture 11 may increase. In addition, the misalignment between the first semiconductor device 1200a and the second semiconductor device 1200b may lead to a failure of the semiconductor architecture 11.

Figure 4:
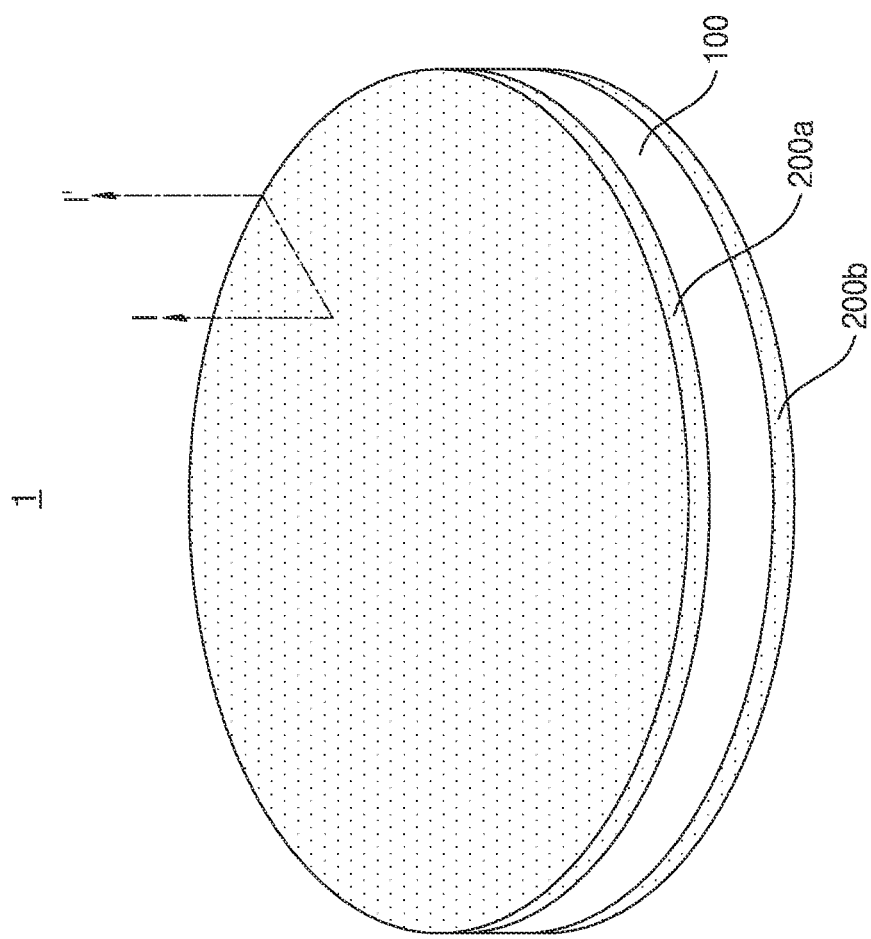
FIG. 4 illustrates a perspective view of a BSPDN semiconductor architecture according to an example embodiment.

FIG. 4 illustrates a perspective view of a BSPDN semiconductor architecture according to an example embodiment.

As illustrated in FIG. 4, the BSPDN semiconductor architecture 1 may include a wafer 100, a first semiconductor device 200a provided on a first surface of the wafer 100, and a second semiconductor device 200b provided on a second surface of the wafer 100 opposite to the first semiconductor device 200a. The first semiconductor device 200a and the second semiconductor device 200b may be integrated to each other and may form a BSPDN semiconductor architecture 1.

The wafer 100 may include, for example, a Si substrate, a glass substrate, a sapphire substrate, etc. However, embodiments are not limited thereto. As illustrated in FIG. 3, the wafer 100 may be a circular panel, but the shape of the wafer 100 is not limited thereto. For example, the wafer 100 may be a tetragonal panel. The wafer 100 may include a single layer or multiple layers.

Figure 5:
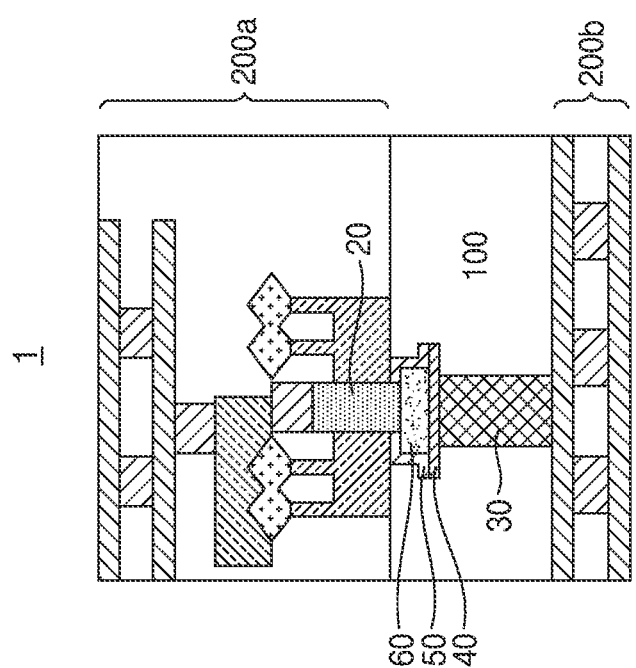
FIG. 5 illustrates a cross-sectional view taken along line I-I' of FIG. 4 according to an example embodiment.

FIG. 5 illustrates a cross-sectional view taken along line I-I' of FIG. 4 according to an example embodiment.

The example BSPDN semiconductor architecture 1 includes a first semiconductor device 200a provided on a first surface of the wafer 100 and a second semiconductor device 200b provided on a second surface of the wafer 100. For example, the first semiconductor device 200a may be an integrated circuit including components such as, for example, active transistors, signal wires, and BPRs 20, etc. The BPR 20 may be provided to face the first surface of the wafer 100. The active transistors may include a power tapping epitaxial layer and a non-power tapping epitaxial layer. The signal wires are connected to the non-power tapping epitaxial layer of the active transistors for signal routing between the active transistors. The BPRs 120 are connected to the power tapping epitaxial layer of the active transistors and are not connected to the signal wires. The BPRs 120 are respectively configured to deliver power to the active transistors. The second semiconductor device 200b may be a PDN integrated circuit. A TSV 30 configured as a power connecting structure may be formed to protrude from a first surface of the second semiconductor device 200b and penetrate the wafer 100.

Referring to FIG. 5, the BSPDN semiconductor architecture 1 also includes a landing pad 60. The landing pad 60 is provided between the BPR 20 and the TSV 30. The landing pad 60 may be covered by a TSV etch stop layer 40 and an encapsulant 50. For example, a second surface of the landing pad 60 may be covered by a TSV etch stop layer 40 and the first surface and the side surfaces of the landing pad 60 may be covered or encapsulated by an encapsulant 50. However, embodiments are not limited thereto. The landing pad 60 may have a rectangular shape from a cross-sectional view and have flat first and second surfaces, but shapes of the landing pad 60 are not limited thereto. The landing pad 60 may be formed of metal having a relatively low resistance. For example, the landing pad 60 may be formed of copper (Cu), cobalt (Co), ruthenium (Ru), etc. However, embodiments are not limited thereto. A width of the landing pad 60 may be greater than a width of the BPR 20 and a width of the TSV 30, but embodiments are not limited thereto.

As illustrated in FIG. 5, the alignment between the BPR 20 and the TSV 30 may be improved as compared to the related embodiment by providing the landing pad 60 which is included in the wafer 100 prior to providing the BPR 20 and the TSV 30. Accordingly, the first semiconductor device 200*a* and the second semiconductor device 200*b* may be more accurately aligned with each other as compared to the related embodiment. Based on the improved alignment of the first semiconductor device 200*a* and the second semiconductor device 200*b*, the integration and performance of the BSPDN semiconductor architecture 1 may be improved. Further, by providing semiconductor devices on both of the first surface of the wafer 100 and the second surface of the wafer 100, the area and the resistance of the BSPDN semiconductor architecture 1 may be reduced.

FIGS. 6A through 6F illustrate a method of manufacturing a BSPDN semiconductor architecture according to an example embodiment.

Referring to FIG. 6A, the method includes providing a wafer 100 including a sacrificial layer 100*a*, an etch stop layer 500, and a carrier substrate 100*b*. The sacrificial layer 100*a* may be a Si bulk layer. The etch stop layer 500 may be provided on the sacrificial layer 100*a*. For example, the etch stop layer 500 may be provided by an epitaxial growth of silicon germanium (SiGe) on the sacrificial layer 100*a*. However, embodiments are not limited thereto. For example, the etch stop layer 500 may be an oxide layer in a silicon-on-insulator (SOI) wafer. The carrier substrate 100*b* may include, for example, a Si substrate, a glass substrate, a sapphire substrate, etc. However, embodiments are not limited thereto.

A TSV etch stop layer 40 is provided on a first surface of the carrier substrate 100*b*.

Referring to FIG. 6B, a landing pad 60 is formed on a first surface of the TSV etch stop layer 40 by depositing and patterning a metal material. The metal material of the landing pad 60 may be a material having a relatively low resistance such as, for example, Cu, Co, Ru, etc. However, embodiments are not limited thereto. According to an example embodiment, the landing pad 60 may have a rectangular shape from a cross-sectional view and have flat first and second surface. However, embodiments are not limited thereto and the landing pad 60 may have various shapes. An encapsulant 50 may be provided on the landing pad 60 and the first surface of the TSV etch stop layer 40 to protect the landing pad 60. For example, the encapsulant 50 may encapsulate the landing pad 60 and the first surface of the TSV etch stop layer 40. The encapsulant 50 may be formed of epoxy resin, silica, etc. However, materials of the encapsulant 50 are not limited thereto.

The encapsulant 50 and the TSV etch stop layer 40 may be removed in areas other than in the area covering the first surface and side surfaces of the landing pad 60 to expose the first surface of the carrier substrate 100*b*. The encapsulant 50 and the TSV etch stop layer 40 may be removed by, for example, patterned etching. However, embodiments are not limited thereto.

A substrate layer 100*b*' may be provided on the landing pad 60 and the exposed first surface of the carrier substrate 100*b*. The substrate layer 100*b*' may be, for example, a Si layer. The substrate layer 100*b*' may be provided to carry out, for example, a front-end-of-line (FEOL) and middle-end-of-line (MEOL) integration in a first semiconductor device 200*a*. The carrier substrate 100*b* and the substrate layer 100*b*' may be integrally formed, and may be together referred to as the carrier substrate 100*b*.

Referring to FIG. 6C, a first a first semiconductor device 200*a* may be provided on a first surface of the carrier substrate 100*b*. The first semiconductor device 200*a* may be an integrated circuit including components such as, for example, active transistors, signal wires, and BPRs 20, etc. The BPR 20 may be provided on a first surface of the carrier substrate 100*b* to be in contact with the landing pad 60 based on a location of the landing pad 60. The location of the landing pad 60 may be detected based on a preset alignment key, but embodiments are not limited thereto.

The landing pad 60 may have a greater width than a width of the BPR 20, but embodiments are not limited thereto. For example, a width of the BPR 20 may range from around 5 nm to 30 nm. However, a width of the BPR 20 is not limited thereto. Based on the width of the landing pad 60 being greater than the width of the BPR 20, aligning and connecting the BPR 20 with the landing pad 60 may be facilitated during a manufacturing process. In addition, as the landing pad 60 is formed prior to providing the BPR 20, the size and shape of the landing pad 60 is not limited by shape and size of the BPR 20 which may facilitate the manufacturing process of the landing pad 60.

Referring to FIG. 6D, a wafer-to-wafer bonding process may be carried out. For example, a second wafer 300 may be provided on a first surface of the first semiconductor device 200*a*. The second wafer 300 may be bonded to the first semiconductor device 200*a* by providing an adhesive layer 400 between the first semiconductor device 200*a* and the second wafer 300. However, embodiments are not limited thereto. According to another example embodiment, the second wafer 300 may be directly provided on the first semiconductor device 200*a*. For example, the second wafer 300 may be directly bonded to the first semiconductor device 200*a* by a Si direct bonding without using an adhesive layer. The wafer-to-wafer bonded semiconductor architecture may be flipped.

Referring to FIG. 6E, the sacrificial layer 100*a* may be removed, and the etch stop layer 500 may be removed to expose the second surface of the carrier substrate 100*b*. For example, the sacrificial layer 100*a* and the etch stop layer 500 may be removed by a grinding process including, for example, chemical-mechanical polishing (CMP) or dry etching. However, embodiments are not limited thereto.

Figure 6F:
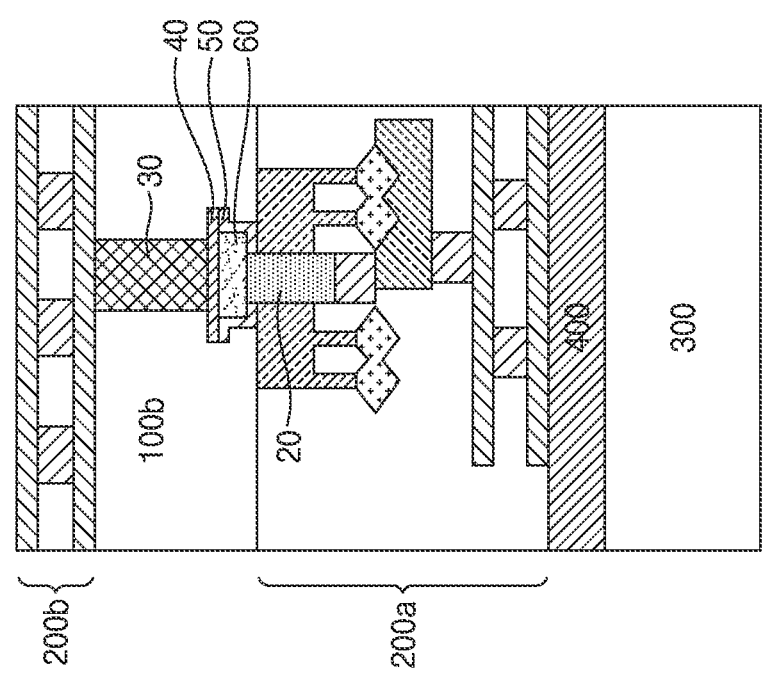

Referring to FIG. 6F, a second semiconductor device 200*b* may be provided on the second surface of the carrier substrate 100*b*. The second semiconductor device 200*b* may be a PDN integrated circuit with, for example, a TSV 30 protruding from a first surface of the second semiconductor device 200*b*. The TSV 30 may be formed to penetrate the carrier substrate 100*b* to contact the landing pad 60 based on a location of the landing pad 60. The location of the landing pad 60 may be detected based on the preset alignment key, but embodiments are not limited thereto.

The landing pad 60 may have a greater width than a width of the TSV 30, but embodiments are not limited thereto. For example, a width of the TSV 30 may range around 50 nm to 100 nm. However, a width of the TSV 30 is not limited thereto. Based on the width of the landing pad 60 being greater than the width of the TSV 30, aligning and connecting the TSV 30 to the landing pad 60 may be easier. As the TSV 30 is better aligned with the landing pad 60 which is connected to the BPR 20, the alignment between the TSV 30 and the BPR 20 may be improved. In addition, even when surfaces of the BPR 20 and the TSV 30 are not fully in contact with the landing pad 60, the connectivity of the BPR 20 and TSV 30 may be improved by being connected through the metal landing pad 60.

As illustrated in FIG. 6F, as the alignment and connectivity between the BPR 20 and the TSV 30 improves, the resistance of the BSPDN semiconductor architecture 1 may be reduced and the IR drop may be improved. In addition, the first semiconductor device 200a and the second semiconductor device 200b may be more accurately aligned and connected with each other to improve the performance of the BSPDN semiconductor architecture 1.

According to the example embodiment, based on the improved alignment between the first semiconductor device 200a and the second semiconductor device 200b, the integration and the performance of the BSPDN semiconductor architecture 1 may be improved. In addition, moving the PDN semiconductor device from the first side to the second side of the wafer 100 may reduce the size and resistance of the BSPDN semiconductor architecture 1.

FIGS. 7A through 7G illustrate a method of manufacturing a BSPDN semiconductor architecture 1 according to another example embodiment.

Referring to FIG. 7A, the method includes providing a wafer 100 including a sacrificial layer 100a, an etch stop layer 500, and a carrier substrate 100b. The sacrificial layer 100a may be a Si bulk layer. The etch stop layer 500 may be provided on the sacrificial layer 100a. For example, the etch stop layer 1500 may be provided by an epitaxial growth of silicon germanium (SiGe) on the sacrificial layer 100a. However, embodiments are not limited thereto. For example, the etch stop layer 500 may be an oxide layer in a silicon-on-insulator (SOI) wafer. The wafer 100 may include, for example, a Si substrate, a glass substrate, a sapphire substrate, etc. However, embodiments are not limited thereto.

A trench 70 is provided on the carrier substrate 100b. For example, the trench 70 may be provided by etching the carrier substrate 100b and may have a rectangular shape from a cross-sectional view. However, embodiments are not limited thereto.

Figure 7B:
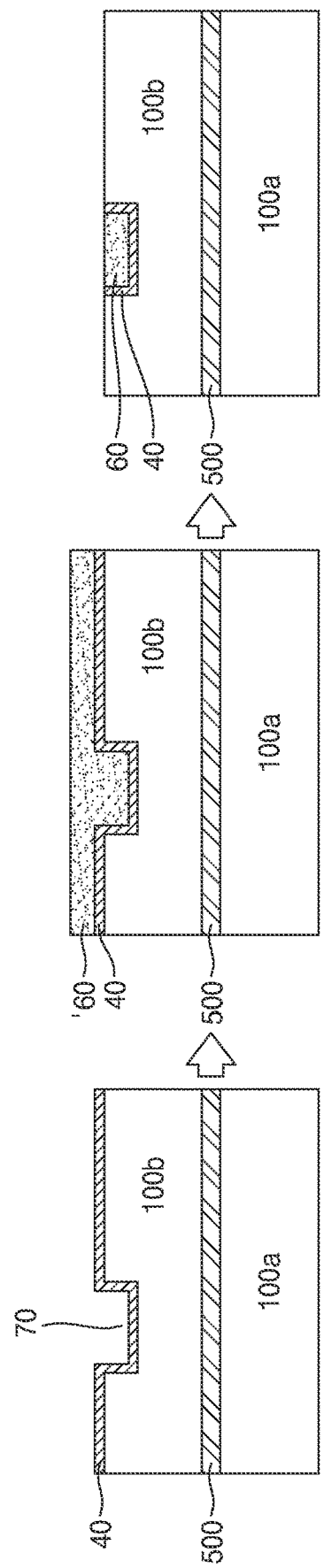

Referring to FIG. 7B, a TSV etch stop layer 40 is provided on a top surface of the carrier substrate 100b and the trench 70. For example, the TSV etch stop layer 40 may be provided to cover the top surface of the carrier substrate 100b and the trench 70. A metal material 60' is provided on the carrier substrate 100b and the trench 70. The metal material 60' may fill the trench 70. The metal material 60' may be a material having a relatively low resistance such as, for example, Cu, Co, Ru, etc. However, embodiment are not limited thereto. The metal material 60' and the TSV etch stop layer 40 may be removed in areas other than the area of a first surface of the trench 70 filled with the metal material 60' to form the landing pad 60 and to expose the first surface of the carrier substrate 100b. The first surface of the landing pad 60 is coplanar to the exposed first surface of the carrier substrate 100b. The metal material 60' and the TSV etch stop layer 40 may be removed by a grinding process such as, for example, CMP or dry etching. As the shape of the landing pad 60 corresponds to the shape of the trench 70, the landing pad 60 may have a rectangular shape. However, embodiments are not limited thereto.

Referring to FIG. 7C, an encapsulant 50 may be provided on an area of the landing pad 60. For example, the encapsulant 50 may cover the landing pad 60 and have a greater size than the landing pad 60 from a plan view. The encapsulant 50 may include epoxy resin, silica, etc., but materials of the encapsulant 50 are not limited thereto. A substrate layer 100b' may be provided on the landing pad 60 and the exposed first surface of the carrier substrate 100b. The substrate layer 100b' may be, for example, a Si layer. The substrate layer 100b' may be provided to carry out, for example, a FEOL and a MEOL process. The carrier substrate 100b and the substrate layer 100b' may be integrally formed, and may be together referred to as the carrier substrate 100b.

Figure 7D:
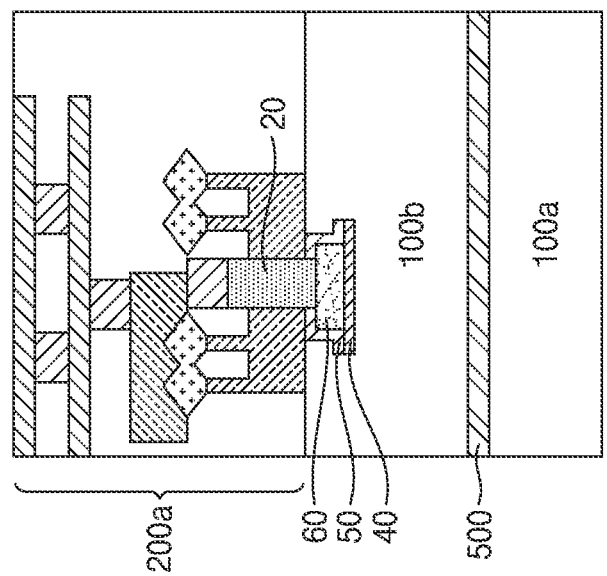

Referring to FIG. 7D, a first semiconductor device 200a may be provided on a first surface of the carrier substrate 100b. The first semiconductor device 200a may be an integrated circuit including components such as, for example, active transistors, signal wires, BPRs 20, etc. The BPR 20 may be provided on a first surface of the carrier substrate 100b to be in contact with the landing pad 60 based on a location of the landing pad 60. The location of the landing pad 60 may be detected based on a preset alignment key, but embodiments are not limited thereto.

The landing pad 60 may have a greater width than a width of the BPR 20, but embodiments are not limited thereto. For example, a width of the BPR 20 may range from around 5 nm to 30 nm. However, a width of the BPR 20 is not limited thereto. Based on the width of the landing pad 60 being greater than the width of the BPR 20, aligning and connecting the BPR 20 to the landing pad 60 may be easier. In addition, as the landing pad 60 is formed prior to providing the BPR 20, the size and shape of the landing pad 60 is not necessarily limited by the size and shape of the BPR 20, and thus, a manufacturing process of the landing pad 60 may be facilitated.

Referring to FIG. 7E, a wafer-to-wafer bonding process may be carried out. For example, a second wafer 300 may be provided on a first surface of the first semiconductor device 200a. The second wafer 300 may be bonded to the first semiconductor device 200a by providing an adhesive layer 400 between the first semiconductor device 200a and the second wafer 300. However, embodiments are not limited thereto. According to another example embodiment, the second wafer 300 may be directly provided on the first semiconductor device 200a. For example, the second wafer 300 may be directly bonded to the first semiconductor device 200a by a Si direct bonding without using an adhesive layer. The wafer-to-wafer bonded semiconductor architecture may be flipped.

Figure 7F:
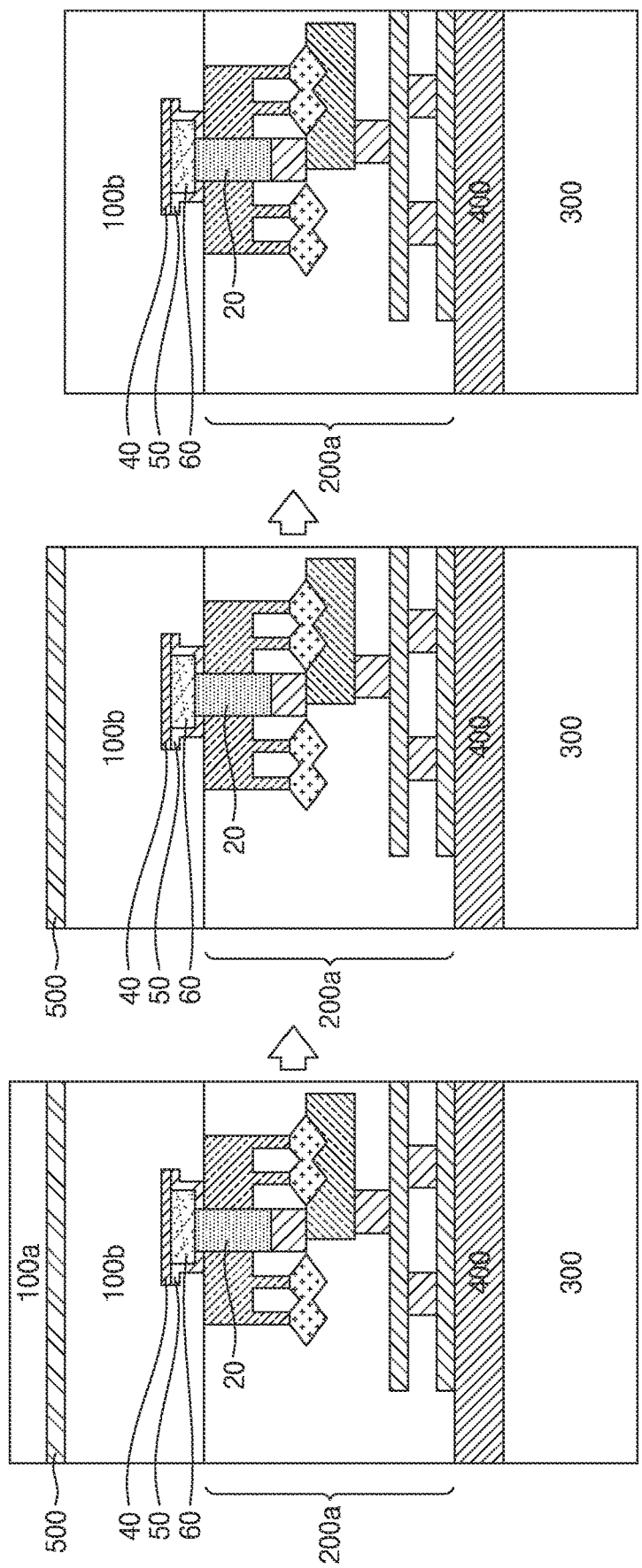

Referring to FIG. 7F, the sacrificial layer 100a may be removed, and the etch stop layer 500 may be removed to expose the second surface of the carrier substrate 100b. For example, the sacrificial layer 100a and the etch stop layer 500 may be removed by a grinding process including, for example, CMP or dry etching, but embodiments are not limited thereto.

Figure 7G:
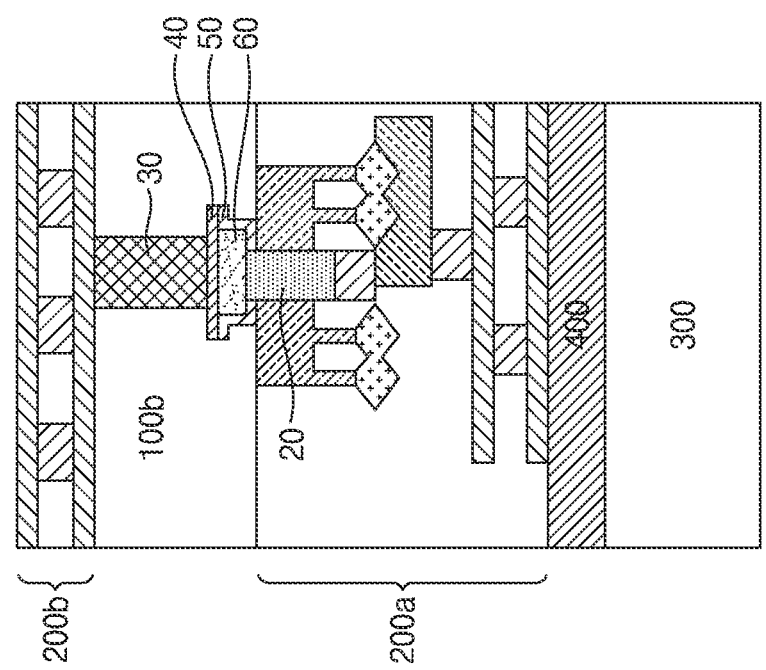

Referring to FIG. 7G, a second semiconductor device 200b may be provided on the second surface of the carrier substrate 100b. The second semiconductor device 200b may be a PDN integrated circuit with, for example, a TSV 30 protruding from a first surface of the second semiconductor device 200b. The TSV 30 may be formed to penetrate the carrier substrate 100b and land on the landing pad 60 based on the location of the landing pad 60. The location of the landing pad 60 may be detected based on the preset alignment key, but embodiments are not limited thereto.

The landing pad 60 may have a greater width than a width of the TSV 30, but embodiments are not limited thereto. For example, a width of the TSV 30 may range around 50 nm to 100 nm. However, a width of the TSV 30 is not limited thereto. Based on the width of the landing pad 60 being greater than the width of the TSV 30, aligning and connecting the TSV 30 to the landing pad 60 may be easier. As the TSV 30 is better aligned with the landing pad 60 which is connected to the BPR 20, the alignment between the TSV 30 and the BPR 20 may be improved. In addition, even when surfaces of the BPR 20 and the TSV 30 are not fully in contact with the landing pad 60, the connectivity of the BPR 20 and TSV 30 may be improved based on being connected through the metal landing pad 60.

As illustrated in FIG. 7G, as the alignment and connectivity between the BPR 20 and the TSV 30 is improved, the resistance of the BSPDN semiconductor architecture 1 may be reduced and the IR drop may be improved. In addition, the first semiconductor device 200a and the second semiconductor device 200b may be more accurately aligned with and connected to each other.

According to the example embodiment, based on the improved alignment between the first semiconductor device 200a and the second semiconductor device 200b, the integration and performance of the semiconductor architecture 1 may be improved.

Figure 8:
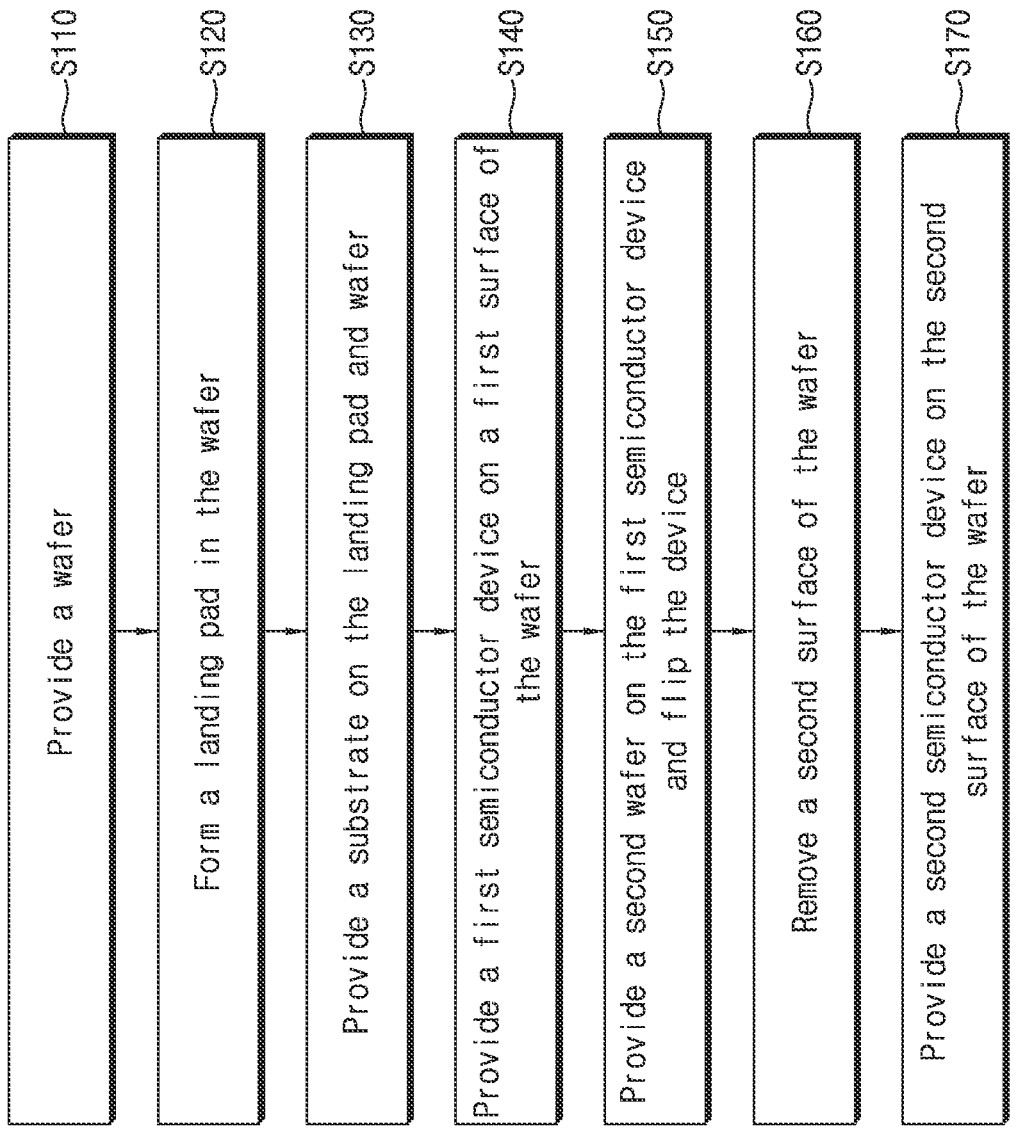
FIG. 8 illustrates a flowchart of a method of manufacturing a BSPDN semiconductor architecture according to an example embodiment.

FIG. 8 illustrates a flowchart of a method of manufacturing a BSPDN semiconductor architecture according to an example embodiment.

According to an example embodiment, a wafer may be provided (S110). The wafer may include a sacrificial layer, an etch stop layer, and a carrier substrate. The sacrificial layer may be a Si bulk layer. The etch stop layer may be provided on the sacrificial layer by an epitaxial growth of silicon germanium (SiGe) on the sacrificial layer, but embodiments are not limited thereto. For example, the etch stop layer may be an oxide layer in a silicon-on-insulator (SOI) wafer. The carrier substrate may include, for example, a Si substrate, a glass substrate, a sapphire substrate, etc.

A landing pad is formed in the wafer (S120). The landing pad may be formed by depositing and patterning a metal material on the carrier substrate, as described in more detail with reference to FIGS. 9 and 10. A substrate is provided on the carrier substrate (S130). The substrate may be a Si layer and may be integrally formed with the carrier substrate.

A first semiconductor device may be provided on the carrier substrate (S140). The first semiconductor device may be an integrated circuit including components such as, for example, active transistors, signal wires, and BPRs. The BPR may be provided on a first surface of the carrier substrate to be in contact with the landing pad based on a location of the landing pad.

A second wafer may be provided on the first semiconductor device (S150). The second wafer may be bonded to the first semiconductor layer by providing an adhesive layer between the first semiconductor device and the second wafer. According to another example embodiment, the second wafer may be directly provided on the first semiconductor device by, for example, a Si direct bonding without using an adhesive layer. The wafer-to-wafer bonded semiconductor architecture may be flipped.

The sacrificial layer and the etch stop layer may be removed (S150). The etch stop layer may be removed to expose the second surface of the carrier substrate. The sacrificial layer and the etch stop layer may be removed by a grinding process such as, for example, CMP or dry etching, but embodiments are not limited thereto.

A second semiconductor device may be provided on the second surface of the carrier substrate (S170). The second semiconductor device may be a PDN integrated circuit with, for example, a TSV protruding from a first surface of the second semiconductor device. The TSV may be formed to penetrate the carrier substrate to be in contact with the landing pad based on the location of the landing pad.

According to the example embodiment, the alignment and connectivity between the BPR and the TSV may be improved, and the resistance of the BSPDN semiconductor architecture 1 may be reduced. In addition, based on the signal wiring device and the PDN being more accurately aligned with each other, performance of the semiconductor architecture may be improved.

Figure 9:
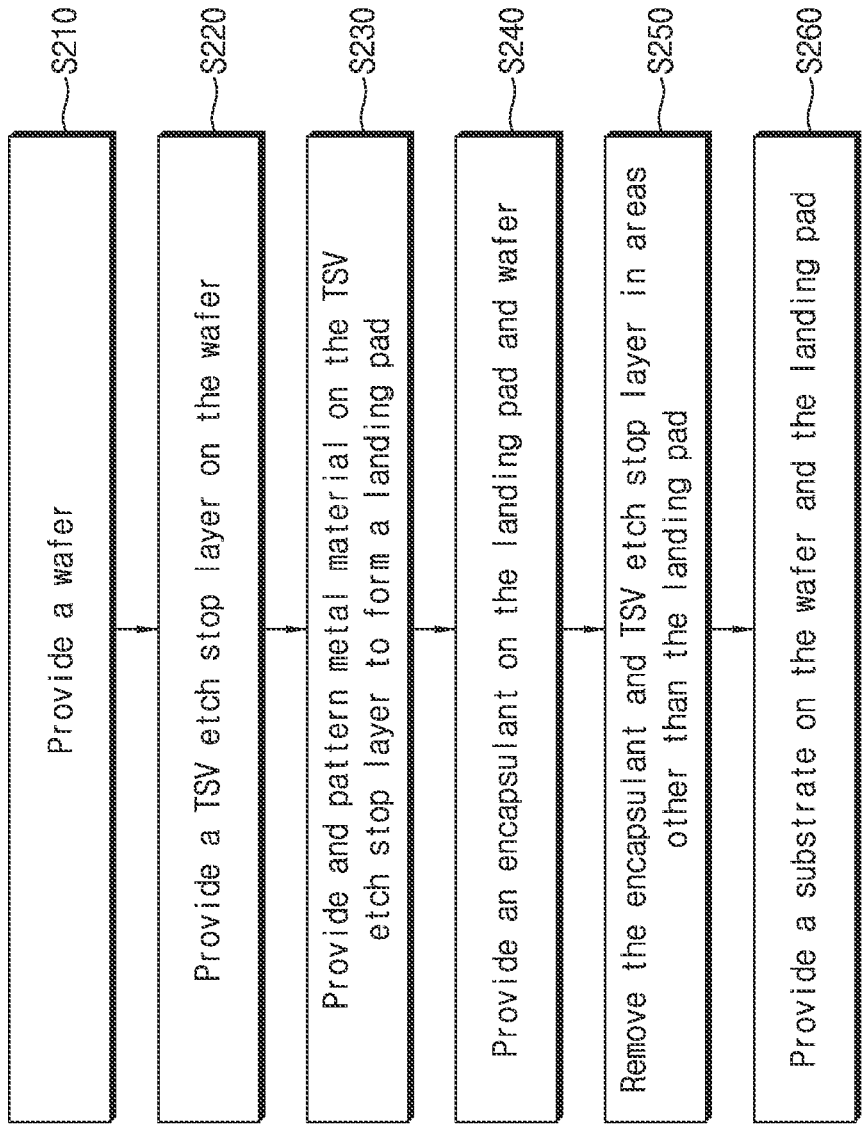
FIG. 9 illustrates a flowchart of a method of manufacturing a landing pad in a semiconductor wafer according to an example embodiment.

FIG. 9 illustrates a flowchart of a method of manufacturing a landing pad in a semiconductor wafer according to an example embodiment.

Referring to FIG. 9, a wafer including a sacrificial layer, an etch stop layer, and a carrier substrate is provided (S210). A TSV etch stop layer may be provided on a first surface of the wafer (S220). A metal material is deposited and patterned on the TSV etch stop layer to form a landing pad (S230). The landing pad may have a rectangular shape. An encapsulant is provided on the landing pad and the first surface of the carrier wafer (S240). The encapsulant and the TSV etch stop layer are removed in areas other than in the area covering the first surface and side surfaces the landing pad (S250). The encapsulant and TSV etch stop layer may be etched to expose the first surface of the wafer. A substrate is provided on the wafer and the landing pad (S260). The substrate may be a Si layer and may be integrally formed with the carrier substrate.

Figure 10:
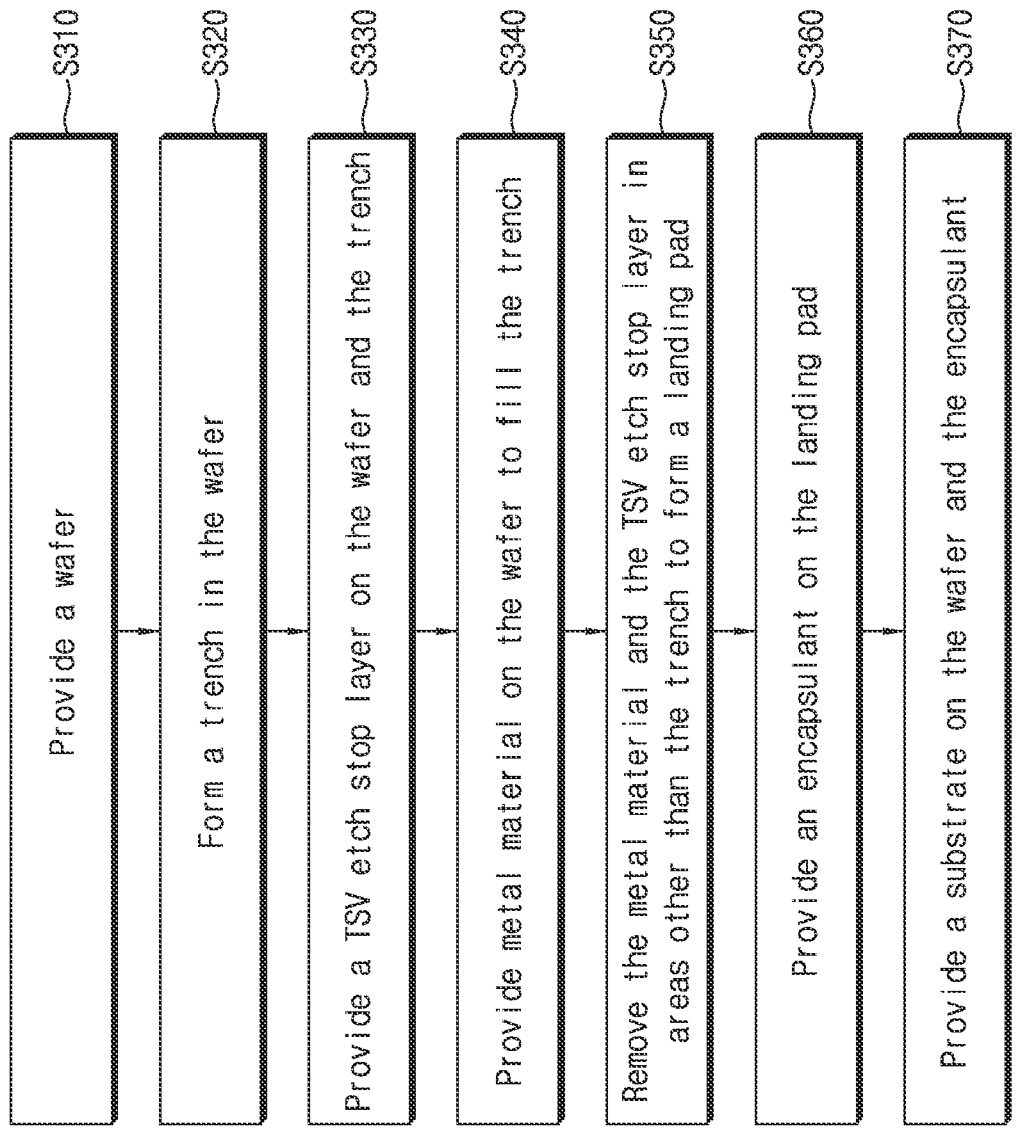
FIG. 10 illustrates a flowchart of a method of manufacturing a landing pad in a semiconductor wafer according to another example embodiment.

FIG. 10 illustrates a flowchart of a method of manufacturing a landing pad in a semiconductor wafer according to another example embodiment.

Referring to FIG. 10, a wafer including a sacrificial layer, an etch stop layer, and a carrier substrate is provided (S310). A trench may be formed in the wafer (S320). The trench may be etched and may have a rectangular shape. A TSV etch stop layer may be provided on the first surface of the wafer and the trench (S330). A metal material may be provided on the first surface of the wafer and fill the trench (S340). The metal material and the TSV etch stop layer may be removed in areas other than the area of a first surface of the trench filled with the metal material to form the landing pad (S350). The metal material and the TSV etch stop layer may be removed by, for example, CMP or dry etching. An encapsulant is provided on an area of the landing pad (S360). A size of the encapsulant may be greater than a size of the landing pad from a plan view. A substrate is provided on the wafer and the landing pad (S370). The substrate may be a Si layer and may be integrally formed with the carrier substrate.

According to example embodiments, as the landing pad is formed prior to the integration of the semiconductor devices on the wafer, manufacturing of the landing pad may be facilitated. For example, a size and shape of the landing pad may not be limited by a size and shape of components of the semiconductor devices such as, for example, a BPR, a TSV, etc.

Figure 11:
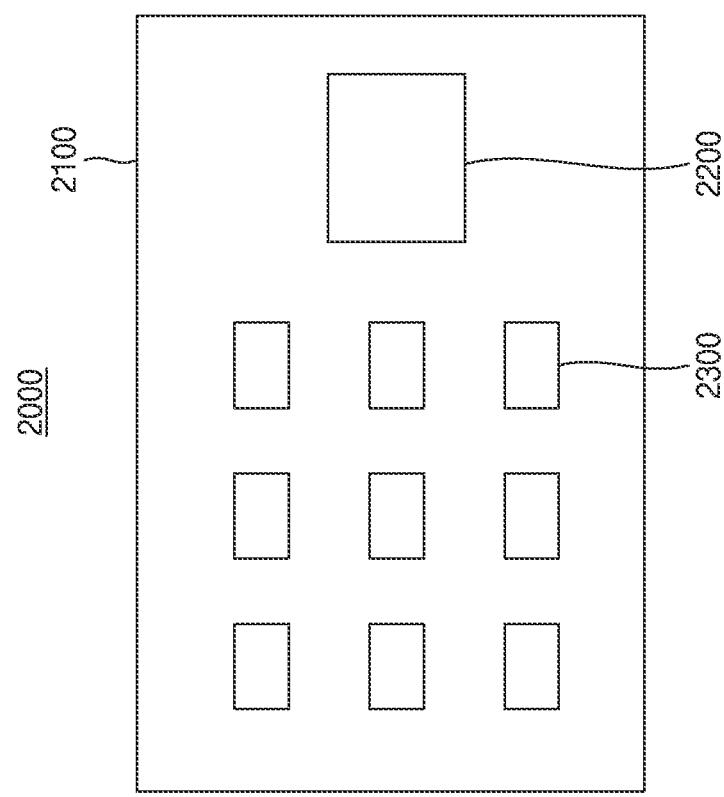
FIG. 11 illustrates a semiconductor architecture that may incorporate the BSPDN semiconductor architectures according to example embodiments.

FIG. 11 illustrates a semiconductor package that may incorporate the BSPDN semiconductor architectures according to example embodiments.

Referring to FIG. 11, a semiconductor package 2000 according to an example embodiment may include a processor 2200 and semiconductor devices 2300 that are mounted on a substrate 2100. The processor 2200 and/or the semiconductor devices 2300 may include one or more of BSPDN semiconductor architecture 1 described in the above example embodiments.

Figure 12:
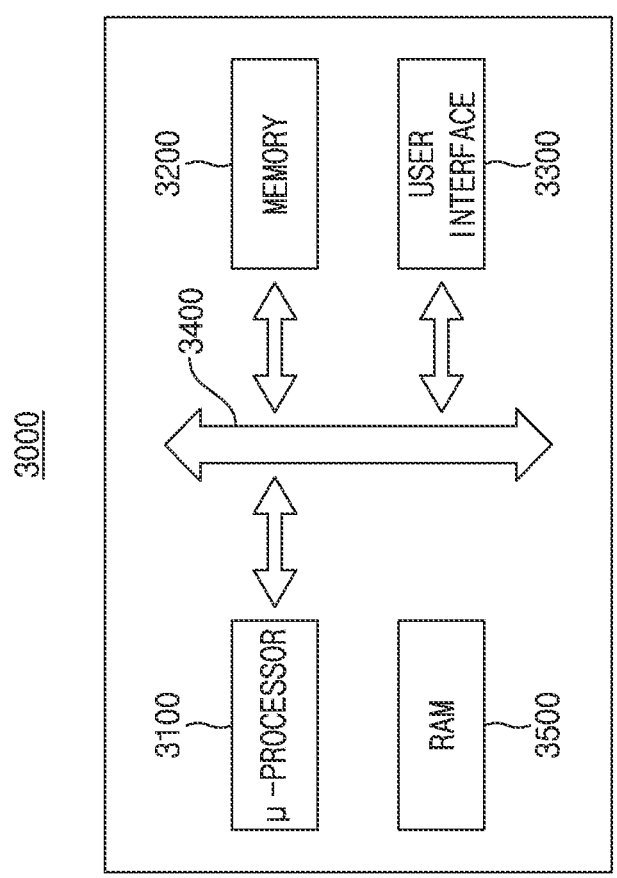
FIG. 12 illustrates a schematic block diagram of an electronic system according to an example embodiment.

FIG. 12 illustrates a schematic block diagram of an electronic system according to an example embodiment.

Referring to FIG. 12, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may include BSPDN semiconductor architecture 1 as described in the above example embodiments.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A semiconductor architecture comprising:
a substrate;
a landing pad included in the substrate;
a first semiconductor device provided on a first surface of the substrate, the first semiconductor device comprising a first component provided on the landing pad; and
a second semiconductor device provided on a second surface of the substrate, a second component protruding from the second semiconductor device being provided on the landing pad,
wherein a width of a horizontal portion of a top surface of the landing pad contacting a bottom surface of the first component is greater than a width of the bottom surface the first component, and
wherein a width of a horizontal portion of a bottom surface of the landing pad contacting a top surface of the second component is greater than a width of the top surface of the second component.

2. The semiconductor architecture according to claim 1, wherein the landing pad comprises a metal material.

3. The semiconductor architecture according to claim 2, wherein the metal material comprises one of copper, cobalt, and ruthenium.

4. The semiconductor architecture according to claim 2, wherein the first component is a buried power rail (BPR) and the second component is a through-silicon via (TSV), and
wherein the landing pad is provided between the BPR and the TSV.

5. The semiconductor architecture according to claim 4, wherein the BPR and the TSV are in contact with the landing pad.

6. The semiconductor architecture according to claim 4, further comprising:
a TSV etch stop layer provided between the landing pad and the TSV; and
an encapsulant provided between the landing pad and the BPR,
wherein side surfaces of the TSV etch stop layer and the encapsulation layer are enclosed in the substrate.

7. The semiconductor architecture according to claim 4, wherein a width of the landing pad is greater than a width of the BPR, and
wherein the width of the landing pad is greater than a width of the TSV.

8. The semiconductor architecture according to claim 1, wherein the landing pad has a rectangular cross-sectional shape.

9. A semiconductor architecture comprising:
a wafer;
a landing pad provided in the wafer;
a semiconductor device for signal routing provided on a first surface of the wafer, the semiconductor device comprising a BPR provided on the landing pad; and
a power distribution network (PDN) semiconductor device provided on a second surface of the wafer, a TSV protruding from the PDN semiconductor device being provided on the landing pad,
wherein a width of a horizontal portion of a top surface of the landing pad contacting a bottom surface of the BPR is greater than a width of the bottom surface the BPR, and
wherein a width of a horizontal portion of a bottom surface of the landing pad contacting a top surface of the TSV is greater than a width of the top surface of the TSV.

* * * * *